(12) United States Patent
Wang et al.

(10) Patent No.: US 9,728,469 B2
(45) Date of Patent: Aug. 8, 2017

(54) METHODS FOR FORMING A STRESS-RELIEVED FILM STACK BY APPLYING CUTTING PATTERNS

(71) Applicant: Taiwan Semiconductor Manufacturing Company, Ltd., Hsin-Chu (TW)

(72) Inventors: Wen-Yun Wang, Taipei (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 87 days.

(21) Appl. No.: 13/801,202

(22) Filed: Mar. 13, 2013

(65) Prior Publication Data

US 2014/0264766 A1    Sep. 18, 2014

Related U.S. Application Data

(60) Provisional application No. 61/778,332, filed on Mar. 12, 2013.

(51) Int. Cl.
    *H01L 21/78* (2006.01)
    *H01L 21/461* (2006.01)
    *H01L 21/66* (2006.01)
    *H01L 23/00* (2006.01)
    *H01L 23/31* (2006.01)

(52) U.S. Cl.
    CPC ............ *H01L 22/20* (2013.01); *H01L 23/562* (2013.01); *H01L 22/12* (2013.01); *H01L 23/3121* (2013.01); *H01L 2924/0002* (2013.01)

(58) Field of Classification Search
    USPC ........ 257/620, 615, 723; 438/457, 459, 460, 438/461, 462, 463, 464, 465, 633, 110, 438/113, 758
    See application file for complete search history.

(56) References Cited

U.S. PATENT DOCUMENTS

| | | | | |
|---|---|---|---|---|
| 6,528,864 B1 * | 3/2003 | Arai | ..................... | H01L 21/3043 257/620 |
| 6,713,843 B2 * | 3/2004 | Fu | ........................... | H01L 22/34 257/620 |
| 7,098,077 B2 * | 8/2006 | Huang | ..................... | H01L 21/78 257/E21.599 |
| 8,017,502 B2 * | 9/2011 | Lee | ........................ | H01L 21/78 438/459 |

(Continued)

*Primary Examiner* — Marc Armand
*Assistant Examiner* — Younes Boulghassoul
(74) *Attorney, Agent, or Firm* — Slater Matsil, LLP (57) ABSTRACT

Disclosed herein is a method of forming a stress relieved film stack, the method comprising forming a film stack on a first side of a substrate, the film stack comprising a plurality of film layers and creating a plurality of film stack openings according to a cutting pattern and along at least a portion of a buffer region. The plurality of film stack openings extend from a top surface of the film stack to the substrate. A deflection of the substrate may be determined, and the cutting pattern selected prior to creating the film stack openings based on the deflection of the substrate. The substrate may have a deflection of less than about 2 μm after creating the plurality of film stack openings. And at least one of the plurality of film layers may comprise one of titanium nitride, silicon carbide and silicon dioxide.

20 Claims, 4 Drawing Sheets

(56) References Cited

U.S. PATENT DOCUMENTS

| | | | |
|---|---|---|---|
| 2002/0151187 A1* | 10/2002 | Ball | H01L 21/78 438/758 |
| 2005/0032334 A1* | 2/2005 | Shibata | H01L 21/6835 438/462 |
| 2006/0024921 A1* | 2/2006 | Huang | 438/462 |
| 2006/0189099 A1* | 8/2006 | Lu | H01L 21/78 438/460 |
| 2010/0112816 A1* | 5/2010 | Marxsen | B24B 37/042 438/692 |
| 2011/0281377 A1* | 11/2011 | Yamada | H01L 21/6836 438/10 |
| 2013/0175671 A1* | 7/2013 | Renaud et al. | 257/615 |

* cited by examiner

METHODS FOR FORMING A STRESS-RELIEVED FILM STACK BY APPLYING CUTTING PATTERNS

CROSS-REFERENCE TO RELATED APPLICATIONS

This application claims the benefit of U.S. Provisional Application No. 61/778,332, filed on Mar. 12, 2013, entitled "System and Method for Film Stress Release," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past. Electronic components may be built vertically from the substrate, permitting greater numbers of components to be located in a given area.

Electronic components may be fabricated using layering techniques. Passivation layers, metallization layers, dielectric layers, masks and the like may all be deposited over a substrate. In some instances, layers may be manipulated or modified after deposition. Some layers, such as masks, passivation layers, dielectric layers and metallization layers may be polished, through, for example, a chemical mechanical polish or the like. Planar surfaces to these layers results in fewer errors in subsequent layers.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific apparatuses and ways to make and use the planar substrate coating, and do not limit the scope of the disclosure.

Embodiments will be described with respect to a specific context, namely making and using planar coatings useful in, for example, semiconductor processing. Other embodiments may also be applied, however, to other coating procedures, including, but not limited to, coatings for packaging, passivation layers, molding compounds, or the like, or another type of planar coating.

The embodiments of the present disclosure are described with reference to FIGS. 1 through 4, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Film layers may be deposited on substrates to form multilayer structures. It has been discovered that forming multiple layers on a substrate may lead to warping of the wafer by the stresses imparted by different layers. Since layers tend to be deposited on a single side of a wafer, the compression or tension created by a particularly layer may affect subsequent layers, and tends to warp the underlying substrate as well. The distortion caused by film stress can lead to inaccurate processing for procedures such as photolithography, die singulation, masking or polishing such by CMP. It has been further discovered that film stress may be relieved by the embodiments presented herein and in particular by isolating the film stack for particular regions prior to stress-sensitive processing.

Figure 1A:
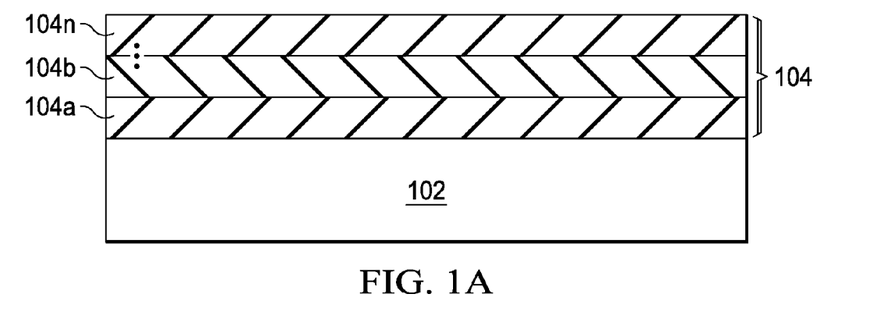
FIGS. 1A-1C and 2A-2B are cross-sectional views of intermediate process steps in forming stress relieved film layers according to various embodiments.

Referring now to FIG. 1A, a film stack 104 disposed on a substrate 102 prior to stress relief by film division according to an embodiment is shown. The substrate 102 may be a wafer, carrier or the like and may be processed. The film stack 104 may one or more layers of material, such as the plurality of film layers 104a, 104b ... 104n. In an embodiment, the film stack 104 may have between about 1 and about 20 film layers 104a ... 104n. Film layers 104a ... 104n may be any type of material, including, but not limited to epi-layers, dielectric layers, metallization layers, masks such as photoresists or nitride hard masks, protective layers, or the like. In an embodiment, the film layers 104a ... 104n may be titanium nitride (TiN), silicon carbide (SiC), silicon dioxide ($SiO_2$), or a polymer such as a cross-linkable polymer. Multiple film layers 104a ... 104n may be deposited to form a film stack 104 using one or more techniques such as chemical vapor deposition (CVD), sputtering, molecular beam epitaxy (MBE), vapor phase or liquid phase epitaxy (VPE or LPE), atomic layer deposition (ALD), plating, spin coating, molding, or any other suitable technique. For example, a first, lowest layer may be passivation layer and alternating layers of dielectric material and metal may form a redistribution layer (RDL) over the passivation layer.

Figure 1B:
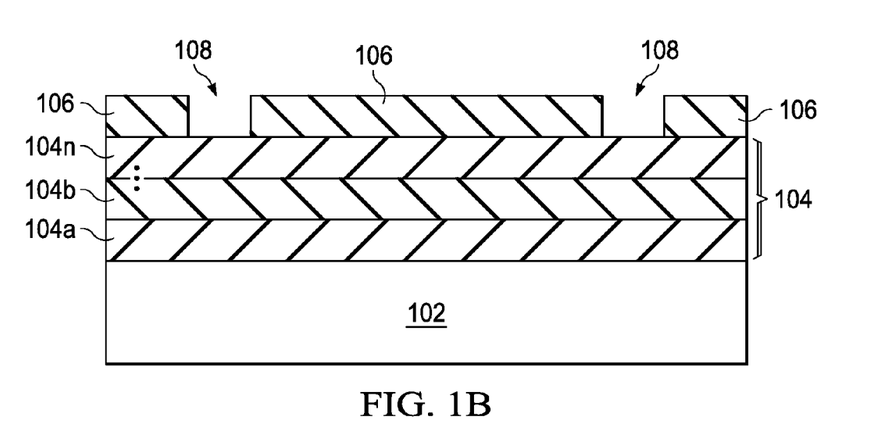

FIG. 1B illustrates masking of a film stack 104 for stress relieving according to an embodiment. A mask 106, such as a photoresist may optionally be deposited to define regions 108 where film stack 104 will be stress relieved. In an embodiment, the mask may be thicker than about 1 µm, and may be exposed using, for example, G-line, Mine, KrF, dry ArF, or immersion ArF tools.

Figure 1C:
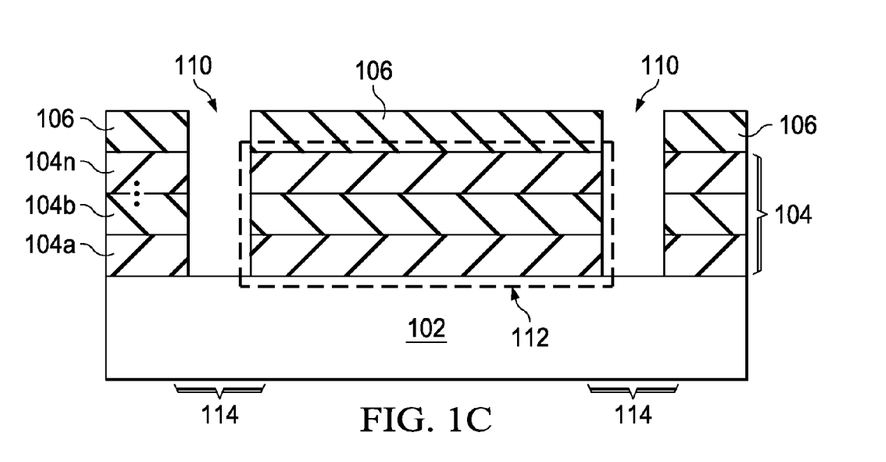

FIG. 1C illustrates cutting a film stack 104 for stress reliving according to an embodiment. The film stack 104 may be separated into smaller film stack regions 112 by creating discontinuities in the film stack 104. One or more openings 110 in the film stack 104 may be created to disconnect adjacent film stack regions 112. The tensions across film layers 104a . . . 104n are relieved because the each film layer 104a . . . 104n has a shorter lateral distance over which stresses are applied, resulting in less distortion of the film stack 104 and the substrate 102. The opening result in stack regions 112 that may, in an embodiment, be disposed over one or more dies. The openings 110 may be made in buffer regions or along cutting lanes or dicing streets, collectively referred to as regions 114, where the substrate 102 may be cut after processing completion to separate individual dies.

A mask 106 may be used where the film stack may be etched by, for example, a wet etch or a dry etch. In an embodiment, the etch may be an anisotropic dry etch such as a plasma etch. In embodiment, depending on the film stack 104 material and crystalline orientation, an anisotropic, orientation dependent wet etch may be performed. Skilled practitioners will recognize that the etchant maybe tailored to the material in each film layer 104a . . . 104n. For example, materials such as silicon, aluminum or copper may be etched with chlorine, while dielectric such as silicon nitride or silicon dioxide may be etched with carbon tetrafluoride or sulfur hexafluoride. In an embodiment, the substrate 102 may have an etch stop layer disposed thereon, with the opening 110 in the film stack 104 etched to the etch stop layer. The opening may also be formed by selectively etching the film stack 104 to form the openings 110 to the substrate 102.

In an embodiment, the film stack 104 may be cut using a mechanical or laser procedure. For example, the film stack may be cut with a saw blade, with a water jet or a like mechanical cutter. In another example, the film stack 104 may be cut with a laser, with the depth of the cut controlled, by, for example, laser power or cutting speed. In an embodiment, the depth of the cut may be determined prior to cutting, for example, by calculating the thickness of the film stack 104 from the processing times of the film layer 104a . . . 104n, or by measuring the thickness of the film stack 104 after formation. In an embodiment, the depth of the cut may be controlled by endpoint detection, where, for example, an optical sensor measures the depth of the cut or otherwise detects that the cut has achieved a specified depth.

The film stack openings 110 may be made in one or more passes. For example, where the film stack 104 is etched, a single etch may performed, with the etch stop layer stopping the etch at a predetermined depth. In another example, a laser or saw may cut the film stack openings 110 using multiple passes, until a predetermined depth is achieved. The film stack openings 110 may be disposed in buffer regions to reduce the waste created by the openings 110. For example, a buffer region may be an area where the film stack 104 or substrate 102 has no metal layer or active components, and so cutting the film stack or substrate will not interfere with the operation or reliability of the device. The buffer region may comprise a dicing street, a part of a dicing street, or other portions of a wafer. For example, a buffer region may be the center portion of a dicing street, so when an opening 110 is formed, subsequent dicing or singulation will cut or remove the opening 110. In another example, the buffer region may be in the film stack over a portion of a die, but where the film stack has no metal layers or other structures used in the operation of the device, so when the opening is created, the operation of the device is maintained. In an embodiment, the width of the opening 110 may be about equal or less than the width of the dicing street, and may equal to or be less than about 100 µm. In an embodiment, the width of the opening 100 may be about 1 µm, and the depth may be about 1 µm.

After cutting the film stack 104, the film stack 104 may be wet cleaned to remove residual material or etching material. In an embodiment, where a mask 106 is used, the wet cleaning may also remove the mask 106 or residual mask material. Subsequent processing steps may then be performed. For example, the film stack 104 may be an RDL that is stress relived and cleaned to remove any excess material resulting from the stress relieving process. Subsequent processing may comprise polishing with a CMP process, masking and deposition of mounting pads, application of a connection structure such as solder ball grid arrays, and the like. Thus, the topmost film layer 104n may be formed and the film stack stress relieved without additional processing steps being applied to the top film layer 104n. Additional processing steps may be performed after the stress relieving procedure. For example, a dielectric film stack with a silicon dioxide top layer may be formed over a substrate. The film stack 104 may be stress relieved by cutting the film stack 104, and then the top film layer 104n may then be polished or ground with a CMP process.

An opening pattern may be determined prior to creating the film stack openings, with the opening pattern optionally determined by one or more predetermined criteria. In an embodiment, a standard opening pattern may be selected, or one of a plurality of standard or predetermined opening patterns may be selected. In another embodiment, the opening pattern may be generated by determining the location of dicing streets, dies, wafer warpage or deflection, or another factor. In an embodiment the deflection of the wafer or film stack 104 may be determined, and a cutting pattern may be selected based on the measured wafer deflection.

Figure 2A:
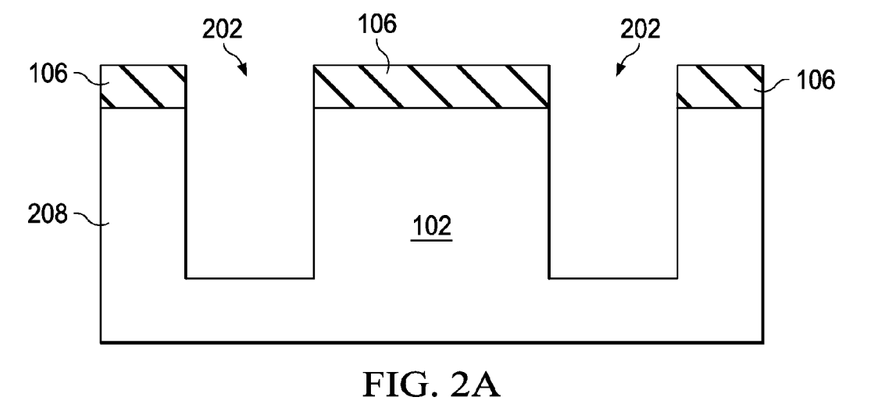

In an embodiment, the film stack 104 may be formed after division of the substrate 102 to provide film stack 104 stress relief. For example, FIG. 2A illustrates a cross-sectional view of division of a substrate 102 prior to forming a film stack 204 (FIG. 2B) according to an embodiment. A mask 106 may optionally be formed over the substrate 102 and subsequently patterned. The patterning may result in openings over regions where the substrate 102 will be divided.

The substrate 102 may be divided prior to formation of the film stack 204 (FIG. 2B) by etching, cutting or the like. In an embodiment, the substrate 102 may be wet or dry etched, for example, using one or more techniques described above. The substrate 102 may also be cut using a laser or other mechanical means as described above. In an embodiment, the substrate 102 may be partially cut, resulting in substrate recesses 202 in the substrate 102 extending only partially through the substrate 102. In an embodiment, the substrate recesses 202 may be cut to a depth greater than the height of the subsequent film stack 204 (FIG. 2B).

The substrate recesses 202 may result in substrate regions 208 that may, in an embodiment, be disposed to encompass or comprise one or more dies. The substrate recesses 202 may be made in buffer regions, such as along cutting lanes or dicing streets where the substrate 102 may be cut after processing completion to separate individual dies. In an embodiment, the substrate recesses may be narrower than the dicing streets or the kerf of the singulation cutter so that any film material on the sidewalls of the substrate recess is removed upon singulation. In an embodiment, the substrate recesses 202 may extend at least about 1 μm into the substrate 102 and may have a width of at least about 1 μm.

Figure 2B:
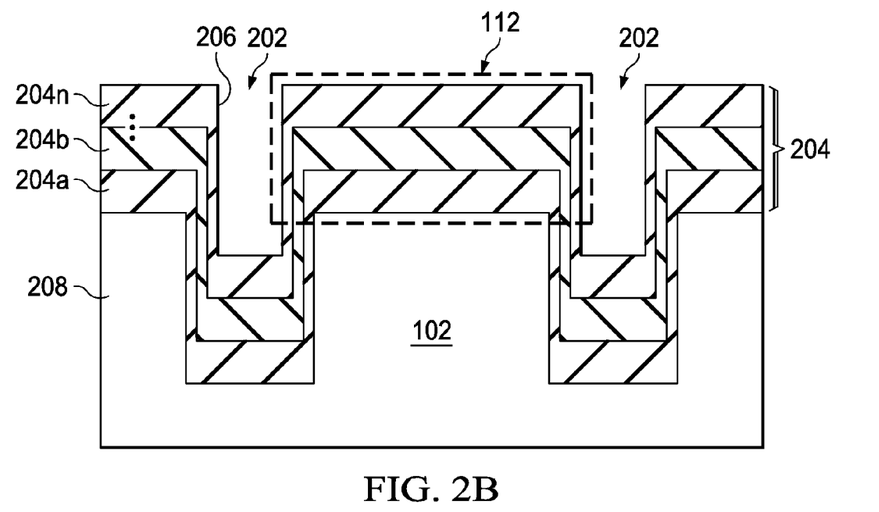

FIG. 2B illustrates a cross-sectional view of formation of a film stack 204 over a divided substrate 102. The films layers 204a . . . 204n may be formed to have film stack regions 112 disposed over the substrate regions 208 between the substrate recesses 202. In an embodiment, the film layers 204a . . . 204n comprising a film stack region 112 will be horizontally separated from adjacent film stack regions 112. Each film layer 204a . . . 204n may have a recessed portion or lower portion that is disposed in the substrate opening 202, creating the separate film layer sections 112. The film layer openings 206 release the stress in each film layer 204a . . . 204n preventing substantial warping of the substrate since the stresses of the film layers 204a . . . 204n have a shorter continuous lateral distance over which to accumulate.

The depth of the substrate recesses 202 will, in an embodiment, be deeper than the thickness of the film stack 204 to prevent the recessed portion of an upper film layer from filling the discontinuity of a lower film layer, so that an upper film layer will not provide a mechanism for laterally transferring the stresses of a lower film layer section to an adjacent film layer section. In an embodiment, a substrate 102 having a divided film stack 204 will have a substantially non-distorted surface, and may have a deflection less than about 2 μm.

The substrate 102 and film stack 204 may be further processed, for example, with a CMP or by singulation. In an embodiment, singulation may comprise cutting the substrate 102 and film stack 204 along the substrate opening 202.

In an embodiment, the substrate 102 may comprise one or more film layers 104a . . . 104n, and stress relief of film layers may be a combination of substrate division and film division. For example, a substrate 102 may have one or more film layers 204a . . . 204n formed thereon. The film layers 204a . . . 204n may be cut, as shown in FIG. 1C, with the film stack openings 110 extending into the substrate 102. Subsequent film layers may be formed over the cut film layers, with the subsequent film layers having lower portions extending into the substrate, as shown in FIG. 2B.

Figure 3A:
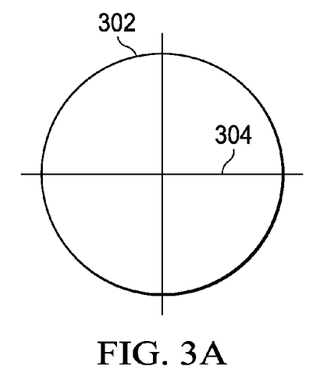
FIGS. 3A-3C are top views of stress relieved film layers according to various embodiments.
Figure 3B:
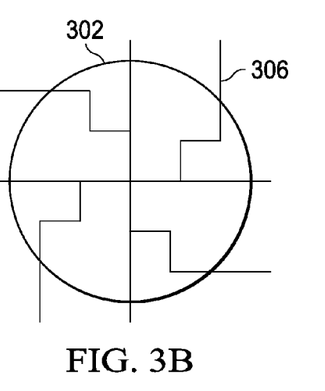
Figure 3C:
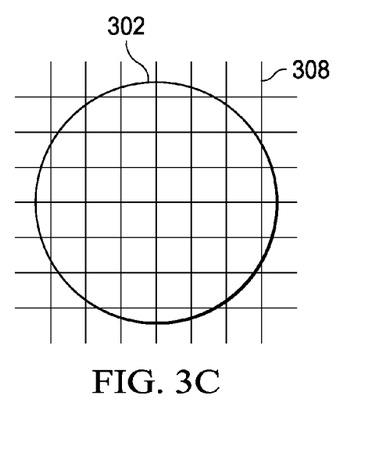

FIGS. 3A-3C illustrate various opening patterns. For example, FIG. 3A illustrates a top view of a stress relieved film layer 302 having an opening pattern 304 created by cutting the film stack 104 (FIG. 1C) or dividing the substrate 102 (FIG. 2A). The opening pattern may be single cut at an angle to another single cut. In an embodiment, the opening pattern 304 may have openings at about 90 degrees to each other.

FIG. 3B illustrates a top view of a stress relieved film layer 302 according to an embodiment. The opening pattern 306 may have one or more openings partially traversing the film layer 302. For example, the openings in the opening pattern 306 may be disposed to avoid dies without extending all the way across the surface of the film layer 302. In an embodiment, the opening pattern 306 may comprise a plurality of openings extending across the film layers 302 in combination with a plurality of openings extending partially across the film layers 302. The combination of openings may be made using a combination of cutting techniques, for example, the openings extending across the film layers 302 may be cut with a mechanical means such as a saw, while the openings extending partially across the film layers 302 may be made with a laser. In another example, the entire opening pattern 306 maybe etched or cut with a laser.

FIG. 3C illustrates a top view of a stress relieved film layer 302 according to an embodiment. In an embodiment, the opening pattern 308 may be a grid, with a first plurality of substantially parallel openings disposed in a first direction and a second plurality of substantially parallel openings disposed in second direction. While the angle between the first direction of the first plurality of openings and the second direction of the second openings may be at any angle, in an embodiment, the first direction may be about 90 degrees from the second direction. Since the openings of the opening pattern 308 extend across the film layers 302, the opening pattern 308 may be made solely using a mechanical cutting process such as a circular or band saw in addition to etching, laser cutting or a combination of the foregoing.

Skilled practitioners will recognize that the number of layers, the type of layers, the thickness of the film stack 104 or substrate 102 or the material of the layers or substrate 102 or other factors may dictate which opening pattern or cutting method may be performed for a particular structure. The warpage or deflection of a wafer may also be used to determine what cut pattern is used. For example, in an embodiment, a maximum acceptable wafer deflection may be about 2 μm. In such an embodiment, a wafer with a deflection of 2.5 μm may be stress relieved using a simple cut pattern, for example, as shown in FIG. 3A, while a wafer with more pronounced deflection of 6 μm may use a more complex opening pattern, for example, as shown in FIG. 3C. Additionally, the warpage or deflection of a particular wafer region may be accounted for in the opening pattern. For example, an opening pattern similar to one illustrated in FIG. 3B may be used to stress relieve particular areas on a wafer.

Figure 4:
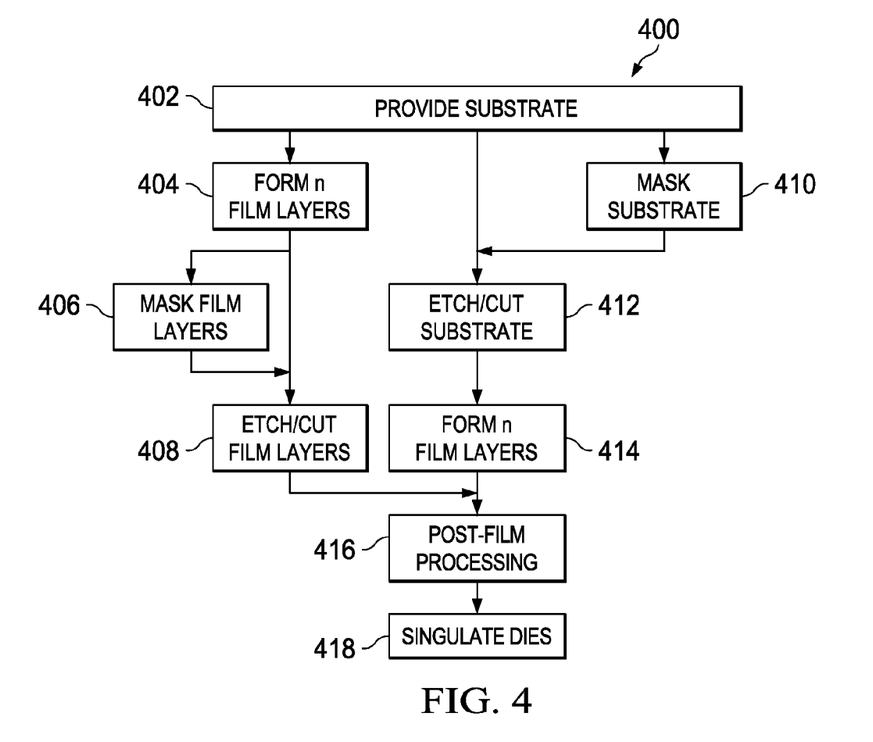
FIG. 4 is a flow diagram illustrating a method for forming a stress relieved film layers according to an embodiment.

FIG. 4 is a flow diagram illustrating a method 400 of forming a stress relieved film stack. A substrate may be provided in 402. In an embodiment, one or more film layers may be formed over the substrate in block 404. The film layers may optionally be masked in block 406. An opening pattern and depth of cut may be determined and the film layers etched or cut in block 408. In another embodiment, the substrate may optionally be masked in block 410. The substrate may be divided by etching or cutting on block 412, and one or more film layers formed over the divided substrate in block 414. After the stress relieved film is formed, post-film processing may be performed in block 416. Dies on the substrate may be singulated in block 418.

Figure 5:
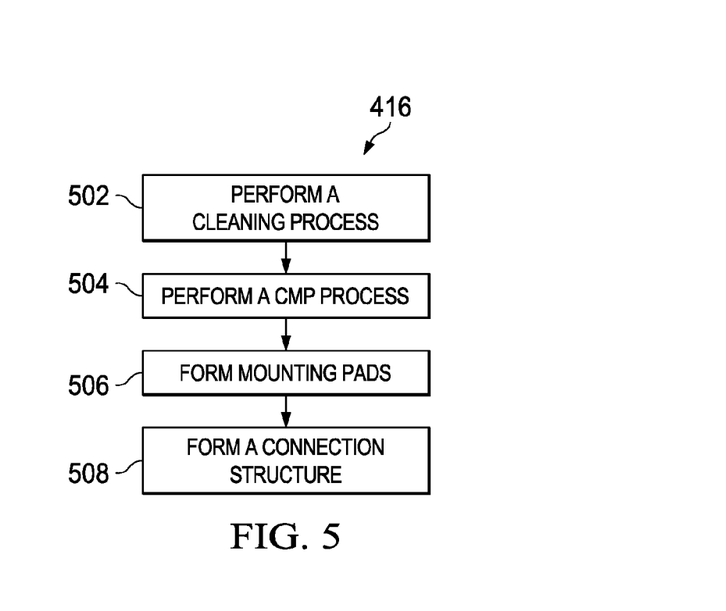
FIG. 5 is a flow diagram illustrating a post-film processing according to an embodiment.

FIG. 5 is a flow diagram illustrating a post-film processing (block 416 of FIG. 4) according to an embodiment. In an embodiment wherein the film stack 104 is the RDL, a cleaning process may be performed in block 502 to remove any excess material resulting from the stress relieving process. Subsequent post-film processing steps may include polishing with a CMP process (block 504), masking and deposition of mounting pads (block 506), application of a connection structure such as solder ball grid arrays, and the like (block 508).

Thus, according to an embodiment, a method of forming a stress relieved film stack may comprise forming a film stack on a first side of a substrate, the film stack comprising a plurality of film layers and creating a plurality of film stack openings according to a cutting pattern and along at least a portion of a buffer region. The plurality of film stack openings extend from a top surface of the film stack to the substrate. A deflection of the substrate may be determined, and the cutting pattern selected prior to creating the film stack openings based on the deflection of the substrate. The substrate may have a deflection of less than about 2 μm after the creating the plurality of film stack openings. And at least one of the plurality of film layers may comprise one of titanium nitride, silicon carbide and silicon dioxide.

According to another embodiment, a method of forming a stress relieved film stack may comprise providing a substrate, dividing the substrate by creating a plurality of substrate recesses extending from a first side of the substrate into the substrate, each of the plurality of substrate recesses disposed in at least a portion of a buffer region and forming a film stack on a first side of a substrate. The film stack may comprise a plurality of film layers, each of the plurality of film layers comprising a lower portion extending into one of the plurality of substrate recesses. A processing step may be performed on a topmost film layer of the film stack after cutting the film stack. Creating the plurality of substrate recesses may comprise forming a mask over the first side of the substrate and etching the substrate or cutting the substrate with a saw or a laser. Each of the plurality of substrate recesses may be formed to a depth of at least about 1 µm or to a depth greater than or equal to a height of the film stack.

A wafer formed according to an embodiment may comprise a substrate, a film stack comprising a plurality of film layers, the film stack disposed on a top surface of the substrate, the film stack comprising a plurality of film stack regions. The wafer may further comprise a plurality of film stack openings disposed in the film stack, and the plurality of film stack openings may separate adjacent ones of the plurality of film stack regions. Each of the plurality of film stack openings may be disposed in respective buffer regions, and the film stack openings may extend from a top surface of the film stack to at least the top surface of the substrate. The buffer regions may be in a dicing street and each of the plurality of film stack openings may be disposed in a dicing street and have a width less than the width of the respective dicing streets. The substrate may comprise a substrate recess having a depth of at least about 1 µm and each of plurality of film layer may comprise a lower portion extending into the substrate recess. At least one of the plurality of film layers may comprise one of titanium nitride, silicon carbide and silicon dioxide.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a stress relieved film stack, comprising:
    forming a film stack on a first side of a substrate, the film stack comprising one or more film layers;
    creating a plurality of film stack openings according to a cutting pattern, wherein the plurality of film stack openings extend from a top surface of the film stack to the first side of the substrate, wherein the creating the plurality of film stack openings comprises:
        cutting by a saw only a first portion of the film stack to create a first set of the plurality of film stack openings, wherein the first set of the plurality of film stack openings extends completely across a surface of the film stack, and wherein the first set of the plurality of film stack openings comprises a first groove and a second groove, wherein the first groove is perpendicular to the second groove in a plan view, and
        cutting by a laser only a second portion of the film stack to create a second set of the plurality of film stack openings, wherein the second set of the plurality of film stack openings extends partially across the surface of the film stack; and
    performing a processing step on a topmost film layer of the film stack after the creating the plurality of film stack openings.

2. The method of claim 1, wherein the plurality of film stack openings are formed in a dicing street.

3. The method of claim 1, wherein at least one of the one or more film layers comprises titanium nitride, silicon carbide, or silicon dioxide.

4. The method of claim 1, wherein the plurality of film stack openings comprise a third groove extending from the first groove or the second groove, the third groove having a first leg, a second leg extending from and perpendicular to the first leg, and a third leg extending from and perpendicular to the second leg, wherein the first groove and the second groove intersect.

5. The method of claim 1 further comprising:
    measuring a deflection of the film stack; and
    selecting, based on the deflection of the film stack, the cutting pattern from a number of predetermined cutting patterns.

6. The method of claim 1 further comprising:
    measuring a deflection of different areas of the film stack; and
    determining the cutting pattern based on the deflection of the different areas of the film stack.

7. The method of claim 1, wherein at least a portion of the plurality of film stack openings are formed in buffer regions of the film stack and the substrate.

8. A method of forming a stress relieved film stack, comprising:
    forming one or more layers on a substrate;
    forming openings in the one or more layers according to a stress-relieving pattern, wherein the openings expose at least a portion of the substrate, wherein the stress-relieving pattern comprises a first set of line segments, a second set of line segments, and a third set of line segments, the first set of line segments being collinear to each other, the second set of line segments being collinear to each other, wherein the first set of line segments are perpendicular to the second set of line segments, wherein a first set of openings are formed according to the first set of line segments and the second set of line segments, the first set of openings being formed by cutting with only a saw the one or more layers and extending completely across a surface of the one or more layers, wherein a second set of openings are formed according to the third set of line segments, the second set of openings being formed by cutting the one or more layers with only a laser and extending partially across the surface of the one or more layers, and wherein the saw or the laser perform one or more cut passes until a predetermined depth of the openings is achieved; and performing a processing step on a topmost layer of the one or more layers.

9. The method of claim 8, further comprising determining the stress-relieving pattern based on at least one of locations of dicing streets on the substrate, locations of dies on the substrate, and a deflection of the substrate.

10. The method of claim 8, wherein the performing the processing step comprises performing a chemical mechanical polishing (CMP) process on the topmost layer of the one or more layers.

11. The method of claim 8 further comprising:
measuring a deflection of the one or more layers; and
selecting, based on the deflection of the one or more layers, the stress-relieving pattern, wherein the stress-relieving pattern is selected from a number of predetermined stress-relieving patterns.

12. The method of claim 8, wherein a lowest layer of the one or more layers is a passivation layer, and remaining layers of the one or more layers form a redistribution layer (RDL) over the passivation layer.

13. The method of claim 8, wherein at least one of the one or more layers comprises titanium nitride, silicon carbide, or silicon dioxide.

14. The method of claim 8, wherein at least a portion of the openings in the one or more layers are formed in buffer regions of the layers and the substrate.

15. A method of forming a stress relieved film stack, comprising:
forming a film stack on a first side of a substrate, the film stack comprising one or more film layers;
determining a stress-relieving pattern;
forming a plurality of stress-relieving openings in the film stack according to the stress-relieving pattern, wherein the plurality of stress-relieving openings expose the first side of the substrate, wherein the plurality of stress-relieving openings form a number of smaller film stack regions, wherein at least one of the number of smaller film stack regions is disposed over at least two dies, wherein a first set of the plurality of stress-relieving openings are formed by a saw only and extend completely across a surface of the film stack, wherein a second set of the plurality of stress-relieving openings are formed by a laser only and extend partially across a surface of the film stack, wherein a first opening of the first set of the plurality of stress-relieving openings is perpendicular to a second opening of the first set of the plurality of stress-relieving openings in a plan view;
performing a plurality of processing steps on a topmost film layer of the film stack after forming the plurality of stress-relieving openings; and
removing the plurality of stress-relieving openings after performing the plurality of processing steps.

16. The method of claim 15, wherein the stress-relieving pattern is determined based on at least one of locations of dicing streets on the substrate, locations of dies on the substrate, and a deflection of the substrate.

17. The method of claim 15, wherein the stress-relieving pattern comprises a first cut and a second cut, the first cut intersecting the second cut, the first cut being at an angle to the second cut.

18. The method of claim 15, wherein a lowest film layer of the film stack is a passivation layer, and remaining layers of the film stack form a redistribution layer (RDL) over the passivation layer.

19. The method of claim 18, wherein the performing the plurality of processing steps comprises:
performing a chemical mechanical polishing (CMP) process on a topmost layer of the RDL layer;
forming mounting pads on the RDL layer; and
forming a connection structure on the mounting pads.

20. The method of claim 15, wherein the plurality of stress-relieving openings are formed along dicing streets of the substrate, and wherein the plurality of stress-relieving openings are removed by singulation of the substrate along the dicing streets.

* * * * *